US009905425B2

(12) United States Patent
Price et al.

(10) Patent No.: US 9,905,425 B2
(45) Date of Patent: Feb. 27, 2018

(54) ENGINEERING THE OPTICAL PROPERTIES OF AN INTEGRATED COMPUTATIONAL ELEMENT BY ION IMPLANTATION

(71) Applicant: Halliburton Energy Services, Inc., Houston, TX (US)

(72) Inventors: James M. Price, The Woodlands, TX (US); Aditya B. Nayak, Humble, TX (US); David L. Perkins, The Woodlands, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 66 days.

(21) Appl. No.: 14/428,722

(22) PCT Filed: Apr. 24, 2014

(86) PCT No.: PCT/US2014/035240
§ 371 (c)(1),
(2) Date: Mar. 17, 2015

(87) PCT Pub. No.: WO2015/163875
PCT Pub. Date: Oct. 29, 2015

(65) Prior Publication Data
US 2016/0260612 A1 Sep. 8, 2016

(51) Int. Cl.
C23C 14/48 (2006.01)
H01L 21/265 (2006.01)
(Continued)

(52) U.S. Cl.
CPC ........ H01L 21/265 (2013.01); C23C 14/0042 (2013.01); C23C 14/0641 (2013.01);
(Continued)

(58) Field of Classification Search
CPC .... C23C 14/221; C23C 14/48; H01J 37/3005; H01J 37/304; H01J 37/317;
(Continued)

(56) References Cited

U.S. PATENT DOCUMENTS 3,542,536 A * 11/1970 Sahineller ............. C03C 23/004
333/239
4,001,049 A * 1/1977 Baglin ................ C03C 23/0055
250/492.3

(Continued)

FOREIGN PATENT DOCUMENTS

WO 2015163875 A1 10/2015

OTHER PUBLICATIONS

Fujimaki et al., "Ion-Implantation-Induced Densification in Silica-Based Glass for Fabrication of Optical Fiber Gratings," J. Appl. Phys. 88, 5534 (2000), vol. 88, No. 10;Nov. 15, 2000; pp. 5534-5537.

(Continued)

Primary Examiner — Marianne L Padgett
(74) Attorney, Agent, or Firm — McDermott Will & Emery LLP

(57) ABSTRACT

Systems and methods of engineering the optical properties of an optical Integrated Computational Element device using ion implantation during fabrication are provided. A system as disclosed herein includes a chamber, a material source contained within the chamber, an ion source configured to provide a high-energy ion beam, a substrate holder to support a multilayer stack of materials that form the Integrated Computational Element device, a measurement system, and a computational unit. The material source provides a material layer to the multilayer stack, and at least a portion of the ion beam is deposited in the material layer according to an optical value provided by the measurement system.

20 Claims, 8 Drawing Sheets

(51) Int. Cl.

| | |
|---|---|
| *C23C 14/22* | (2006.01) |
| *G01B 11/06* | (2006.01) |
| *G02B 5/28* | (2006.01) |
| *H01L 21/67* | (2006.01) |
| *C23C 14/00* | (2006.01) |
| *C23C 14/06* | (2006.01) |
| *C23C 14/16* | (2006.01) |
| *C23C 14/18* | (2006.01) |
| *H01J 37/317* | (2006.01) |
| *H01L 21/66* | (2006.01) |

(52) U.S. Cl.
CPC .............. *C23C 14/16* (2013.01); *C23C 14/18* (2013.01); *C23C 14/221* (2013.01); *C23C 14/48* (2013.01); *G01B 11/0625* (2013.01); *G01B 11/0683* (2013.01); *G02B 5/285* (2013.01); *H01J 37/3171* (2013.01); *H01L 21/67213* (2013.01); *H01L 21/67253* (2013.01); *H01L 22/34* (2013.01)

(58) Field of Classification Search
CPC ............... H01J 37/3171; H01J 37/3178; H01J 2237/316; H01J 2237/3165; H01J 2237/31701–2237/31713; H01L 21/265; H01L 21/67213; H01L 21/67253; H01L 22/34; G01B 11/0683; G01B 11/0625; G02B 5/285
USPC ......... 427/8–10, 523–531, 533; 438/16, 244, 438/246, 247, 251–253, 302, 305–307, 438/369–377, 423, 449–451, 473, 438/514–534, 766, 798
See application file for complete search history.

(56) References Cited

U.S. PATENT DOCUMENTS

| | | | | | |
|---|---|---|---|---|---|
| 4,545,646 | A * | 10/1985 | Chern | .................... | B01J 12/02 359/569 |
| 5,098,792 | A * | 3/1992 | Sebastiano | .......... | C03C 23/0055 427/165 |
| 5,354,575 | A * | 10/1994 | Dagenais | .............. | C23C 14/547 204/192.13 |
| 6,141,103 | A * | 10/2000 | Pinaton | .............. | G01B 11/0641 356/369 |
| 6,781,692 | B1 * | 8/2004 | Rosencwaig | ........ | G01N 21/211 250/255 |
| 7,110,912 | B1 * | 9/2006 | Tiwald | ................... | G01N 21/41 702/170 |
| 8,338,194 | B2 * | 12/2012 | Hesse | ................ | G01B 11/0625 438/16 |
| 8,918,198 | B2 * | 12/2014 | Atanasoff | .......... | G01B 11/0625 700/104 |
| 9,395,721 | B2 * | 7/2016 | Perkins | .............. | G01B 11/0683 |
| 9,657,391 | B2 * | 5/2017 | Price | ....................... | C23C 14/54 |
| 2002/0080493 | A1 | 6/2002 | Tsai et al. | | |
| 2003/0035640 | A1 * | 2/2003 | Dugan | .................... | G02B 6/122 385/124 |
| 2004/0017991 | A1 * | 1/2004 | Brady | ................ | G02B 6/12011 385/130 |
| 2004/0061868 | A1 * | 4/2004 | Chapman | ........... | G01B 11/0616 356/503 |
| 2004/0169836 | A1 * | 9/2004 | Wegmann | .......... | G02B 27/0012 355/67 |
| 2006/0011906 | A1 | 1/2006 | Bedell et al. | | |
| 2006/0228897 | A1 | 10/2006 | Timans | | |
| 2007/0087578 | A1 | 4/2007 | Sugiyama et al. | | |
| 2007/0141734 | A1 | 6/2007 | Flynn | | |
| 2008/0096359 | A1 * | 4/2008 | Gupta | ................. | H01J 37/1471 438/302 |
| 2008/0237492 | A1 | 10/2008 | Caliendo et al. | | |
| 2008/0311686 | A1 * | 12/2008 | Morral | .............. | H01L 21/26506 438/7 |
| 2009/0010135 | A1 * | 1/2009 | Ushiro | ..................... | G03H 1/02 369/112.01 |
| 2010/0200774 | A1 | 8/2010 | Burke et al. | | |
| 2010/0291714 | A1 * | 11/2010 | Hesse | ................ | G01B 11/0625 438/16 |
| 2011/0276166 | A1 * | 11/2011 | Atanasoff | .......... | G01B 11/0625 700/104 |
| 2012/0208377 | A1 | 8/2012 | Timans | | |
| 2012/0211166 | A1 | 8/2012 | Yevtukhov et al. | | |
| 2015/0162030 | A1 * | 6/2015 | Jayashankar | ........ | G11B 5/3163 427/526 |
| 2016/0018818 | A1 * | 1/2016 | Perkins | .............. | G01B 11/0683 702/83 |
| 2016/0130696 | A1 * | 5/2016 | Price | ........................ | C23C 14/54 427/10 |
| 2016/0289821 | A1 * | 10/2016 | Nayak | .................... | C23C 14/547 |
| 2016/0292338 | A1 * | 10/2016 | Perkins | ................. | C23C 14/545 |
| 2017/0175256 | A1 * | 6/2017 | Perkins | ................. | C23C 14/547 |

OTHER PUBLICATIONS

International Search Report and Written Opinion for PCT/US2014/035240 dated Jan. 21, 2015.

EP Examination Report received in corresponding EP Application No. 14845029.9, dated Jul. 8, 2016.

Official Action for European Patent Application No. 14845029.9 dated Nov. 18, 2015.

* cited by examiner

ENGINEERING THE OPTICAL PROPERTIES OF AN INTEGRATED COMPUTATIONAL ELEMENT BY ION IMPLANTATION

BACKGROUND

The present disclosure relates to optical thin-film based Integrated Computational Element (ICE) devices and, more particularly, to systems and methods of engineering the optical properties of an optical thin-film based ICE device using ion implantation during fabrication.

In the field of thin-film device fabrication for optical purposes, designs of a multilayered thin-film device may seek specific spectral performances. As each of the layers is formed in a stack, fabrication variability results in a multilayered film that may exhibit an incorrect performance at certain wavelengths, or in certain ranges of wavelengths. Once fabrication of the optical thin-film based ICE device is finished and tested, fabrication errors in the ICE device that are beyond a specified tolerance result in the ICE device being discarded and fabrication of a new ICE device is then required. As can be appreciated, this procedure results in waste of time and materials, in detriment of fabrication cost efficiency.

Some fabrication techniques provide alternatives to modifying the optical properties of the multilayer stack in a thin-film based ICE device in-situ or after it is complete (ex-situ), such as by changing temperature and deposition conditions. These fabrication techniques, however, are hard to control. Other approaches simply add further material layers to the stack for correction, but this has the deleterious effect of increasing cost, thickness, and overall optical density of the ICE device. When an error is detected, a correction typically includes changing the thickness of subsequent material layers to compensate for the spectral mismatch. While this may result in more accurate spectral performance, the resulting layer stack may have an incompatible thickness, or the required correction thickness may not be feasible when a large number of errors accumulate.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
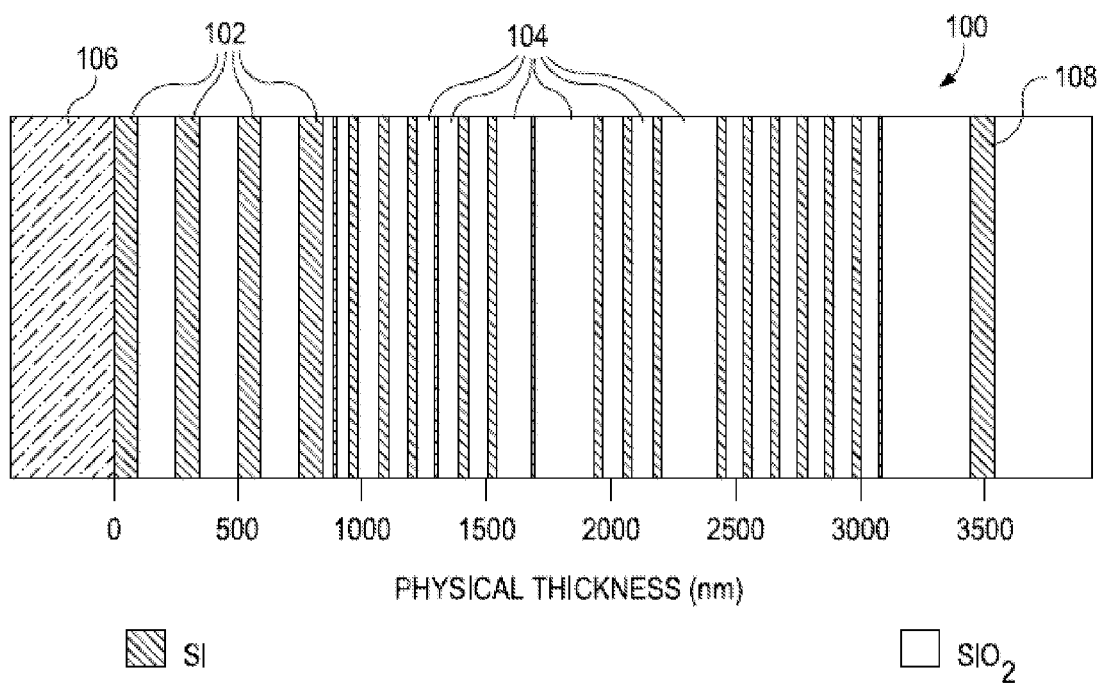
FIG. 1 illustrates an exemplary optical thin-film based integrated computational element (ICE), according to some embodiments.

The present disclosure relates to optical thin-film based Integrated Computational Elements (ICE) and, more particularly, to systems and methods of engineering the optical properties of an optical thin-film based ICE using ion implantation during fabrication.

The present disclosure provides improved systems and methods for characterizing layers of optical thin-films, such as layers of integrated computational element (ICE) cores, during fabrication. Systems and methods of engineering the optical properties of an optical thin-film based ICE using ion implantation during fabrication are provided. A system as disclosed herein includes a chamber, a material source contained within the chamber, an ion source configured to provide an ion beam, a substrate holder to support a multilayer stack of materials that form the ICE device, a measurement system, and a computational unit. The material source provides a material layer to the multilayer stack, and at least a portion of the ion beam is deposited in the material layer according to an optical value provided by the measurement system. As described herein, ion implantation techniques can advantageously alter the optical properties of a single layer, or stack of layers of an ICE device differently than current fabrication techniques. This allows more flexibility in designing and fabricating optical thin-film based ICE devices.

Optical computing devices, also commonly referred to as "opticoanalytical devices," can be used to analyze and monitor a substance in real time. Such optical computing devices will often employ a light source emitting electromagnetic radiation that reflects or refracts from a substance and optically interacts with an optical processing element to determine quantitative and/or qualitative values of one or more physical or chemical properties of the substance. The optical element may be, for example, an integrated computational element (ICE), which may act as an optical interference filter based device that can be designed to operate over a continuum of wavelengths in the electromagnetic spectrum from the UV to mid-infrared (MIR) ranges, or any sub-set of that region. Electromagnetic radiation that optically interacts with the substance is changed and processed by the ICE so as to be readable by a detector, such that an output of the detector can be correlated to the physical or chemical property of the substance being analyzed.

An exemplary optical thin-film based ICE typically includes a plurality of optical layers consisting of various materials whose index of refraction and size (e.g., thickness) may vary between each layer. The design of an ICE (referred to herein as an "ICE design") refers to the number and thicknesses of the respective layers of the ICE. The layers may be strategically deposited and sized so as to selectively pass predetermined fractions of electromagnetic radiation at different wavelengths configured to substantially mimic a regression vector corresponding to a particular physical or chemical property of interest of a substance. Accordingly, an ICE design will exhibit a transmission function that is weighted with respect to wavelength. As a result, the output light from the ICE conveyed to the detector may be related to the physical or chemical property of interest for the substance.

The presently disclosed systems and methods may be suitable for the design and fabrication of ICEs. However, it will be appreciated that the various disclosed systems and methods are equally applicable to fabrication of any thin-film used in thin-film applications. Such application areas and technology fields may include, but are not limited to, the oil and gas industry, food and drug industry, industrial applications, the mining industry, the optics industry, the eyewear industry, the electronics industry, and the semiconductor industry.

As used herein, the term "characteristic" refers to a chemical, mechanical, or physical property of a substance. The characteristic of a substance may include a quantitative or qualitative value of one or more chemical constituents or compounds present therein or any physical property associated therewith. Such chemical constituents and compounds may be referred to herein as "analytes." Illustrative characteristics of a substance that can be detected with the ICEs described herein can include, for example, chemical composition (e.g., identity and concentration in total or of individual components), phase presence (e.g., gas, oil, water, etc.), impurity content, pH, alkalinity, viscosity, density, ionic strength, total dissolved solids, salt content (e.g., salinity), porosity, opacity, bacteria content, total hardness, transmittance, combinations thereof, state of matter (solid, liquid, gas, emulsion, mixtures, etc.), and the like.

As used herein, the term "substance," or variations thereof, refers to at least a portion of matter or material of interest to be tested or otherwise evaluated using the ICEs described herein. The substance includes the characteristic of interest, as defined above. The substance may be any fluid capable of flowing, including particulate solids, liquids, gases (e.g., air, nitrogen, carbon dioxide, argon, helium, methane, ethane, butane, and other hydrocarbon gases, hydrogen sulfide, and combinations thereof), slurries, emulsions, powders, muds, glasses, mixtures, combinations thereof, and may include, but is not limited to, aqueous fluids (e.g., water, brines, etc.), non-aqueous fluids (e.g., organic compounds, hydrocarbons, oil, a refined component of oil, petrochemical products, and the like), acids, surfactants, biocides, bleaches, corrosion inhibitors, foamers and foaming agents, breakers, scavengers, stabilizers, clarifiers, detergents, a treatment fluid, fracturing fluid, a formation fluid, or any oilfield fluid, chemical, or substance as found in the oil and gas industry. The substance may also refer to a solid material such as, but not limited to, rock formations, concrete, solid wellbore surfaces, and solid surfaces of any wellbore tool or projectile (e.g., balls, darts, plugs, etc.).

As used herein, the term "electromagnetic radiation" refers to radio waves, microwave radiation, terahertz, infrared and near-infrared radiation, visible light, ultraviolet light, X-ray radiation and gamma ray radiation.

As used herein, the term "optically interact" or variations thereof refers to the reflection, transmission, scattering, diffraction, or absorption of electromagnetic radiation either on, through, or from one or more processing elements (i.e., an ICE or other Integrated Computational Element(s) not characterized as an optical thin-film based device), a substance being analyzed by the processing elements, or a polarizer. Accordingly, optically interacted light refers to electromagnetic radiation that has been reflected, transmitted, scattered, diffracted, or absorbed by, emitted, or re-radiated, for example, using a processing element, but may also apply to optical interaction with a substance or a polarizer.

Referring to FIG. 1, illustrated is an exemplary ICE 100, according to one or more embodiments of the present disclosure. As illustrated, the ICE 100 may include a plurality of alternating layers 102 and 104, such as silicon (Si) and $SiO_2$, respectively. In general, these layers 102, 104 consist of materials whose refraction coefficient is high and low, respectively. The refraction coefficient as used hereinafter is the real part of the complex index of refraction. Other examples of materials might include niobia and niobium, germanium and germania, $MgF_2$, $SiO_2$, and other high and low index materials known in the art. Layers 102, 104 may be strategically deposited on an optical substrate 106. In some embodiments, optical substrate 106 is BK-7 optical glass. In other embodiments, the optical substrate 106 may be another type of optical substrate, such as quartz, sapphire, silicon, germanium, zinc selenide, zinc sulfide, or various plastics such as polycarbonate, polymethylmethacrylate (PMMA), polyvinylchloride (PVC), diamond, ceramics, combinations thereof, and the like.

At the opposite end (e.g., opposite optical substrate 106 in FIG. 1), ICE 100 may include a layer 108 that is generally exposed to the environment of the device or installation, and may be able to detect a sample substance. The number of layers 102, 104 and the thickness of each layer 102, 104 are determined from the spectral attributes acquired from a spectroscopic analysis of a characteristic of the substance being analyzed using a conventional spectroscopic instrument. The spectrum of interest of a given characteristic typically includes any number of different wavelengths.

It should be understood that ICE 100 in FIG. 1 does not in fact represent any particular ICE configured to detect a specific characteristic of a given substance, but is provided for purposes of illustration only. Consequently, the number of layers 102, 104 and their relative thicknesses, as shown in FIG. 1, bear no correlation to any particular substance or characteristic thereof. Nor are layers 102, 104 and their relative thicknesses necessarily drawn to scale, and therefore should not be considered limiting of the present disclosure.

In some embodiments, the material of each layer 102, 104 can be doped or two or more materials can be combined in a manner to achieve the desired optical characteristic. In addition to solids, the exemplary ICE 100 may also contain liquids and/or gases, optionally in combination with solids, in order to produce a desired optical characteristic. In the case of gases and liquids, ICE 100 can contain a corresponding vessel (not shown), which houses the gases or liquids. Exemplary variations of ICE 100 may also include holographic optical elements, gratings, piezoelectric, light pipe, and/or acousto-optic elements, for example, that can create transmission, reflection, and/or absorptive properties of interest.

The multiple layers 102, 104 may exhibit different refractive indices. By properly selecting the materials of layers 102, 104 and their relative thickness and spacing, ICE 100 may be configured to selectively pass/reflect/refract/absorb predetermined fractions of electromagnetic radiation at different wavelengths. Each wavelength is given a predetermined weighting or loading factor. The thickness and spacing of layers 102, 104 may be determined using a variety of approximation methods from the spectrum of the characteristic or analyte of interest. These methods may include inverse Fourier transform (IFT) of the optical transmission spectrum and structuring the ICE 100 as the physical representation of the IFT. The approximations convert the IFT into a structure based on known materials with constant refractive indices.

The weightings that layers 102, 104 of ICE 100 apply at each wavelength may be set to the regression weightings described with respect to a known equation, data, or spectral signature. For instance, when electromagnetic radiation interacts with a substance, unique physical and chemical information about the substance may be encoded in the electromagnetic radiation that is reflected from, transmitted through, or radiated from the substance. This information is often referred to as the spectral "fingerprint" of the substance. ICE 100 may be configured to perform the dot product of the received electromagnetic radiation and the wavelength dependent transmission function of the ICE 100. The wavelength dependent transmission function of ICE 100 is dependent on the material refractive index of each layer, the number of layers 102, 104 and thickness of each layer 102, 104. Thus, it can be appreciated that performing spectroscopic measurements on layers 102, 104 during fabrication may indicate proper or improper refractive indexes and layer 102, 104 thicknesses, and further enable correction adjustments as necessary for proper operation of ICE 100 upon fabrication completion.

Embodiments disclosed herein provide methods and systems that may prove useful in altering the optical properties of a material in an ICE by ion implantation. More particularly, the presently disclosed embodiments provide for engineering the optical properties of a thin-film based Integrated Computational Element material deposited on an ICE layer stack. Materials forming the layers in an ICE layer stack may include dielectric materials and other types of materials, such as semiconductors, or even metals or metal alloys. Some embodiments disclose adjusting the ICE spectral profile using ion implantation, even when material deposition conditions alone are insufficient to produce detailed optical properties due to fabrication variability. Likewise, methods and systems disclosed herein may correct the ICE spectral profile when the deposition process has deviated from the target design, and the optical properties need adjustment.

Figure 2:
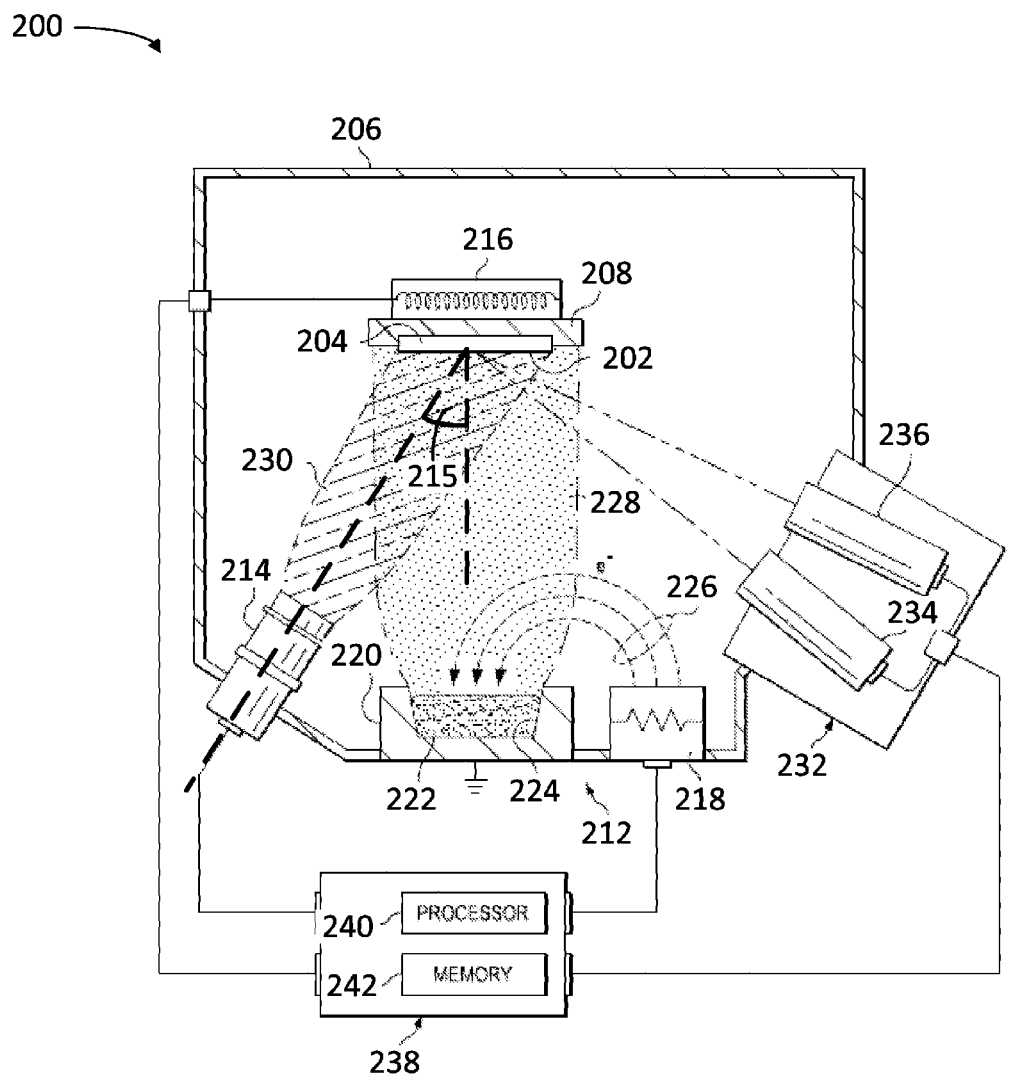
FIG. 2 illustrates an exemplary system for fabricating an optical thin-film device, according to some embodiments.

FIG. 2 illustrates an exemplary system 200 that may be used for fabricating the ICE thin-film based device, according to one or more embodiments. System 200 may be configured to improve optical-spectrum fidelity of an ICE 202 fabricated on a substrate 204. In some embodiments, substrate 204 includes an optically transparent material, such as glass, plastic, or other dielectric material. In some embodiments, ICE 202 may be configured to transmit an optical spectrum representing a chemical constituent of a production fluid from a wellbore or other fluid. According to some embodiments, ICE 202 may be configured to reflect an optical spectrum representing a chemical constituent of a production fluid from a wellbore or other fluid.

System 200 includes a chamber 206, or vessel, and a substrate holder 208. In some embodiments, chamber 206 may be placed at a low pressure to facilitate material deposition. In some embodiments chamber 206 is set to about $10^{-7}$ Torr. Substrate holder 208 secures substrate 204 within chamber 206 relative to a mass-flux generator 212 and an ion-beam generator 214. Substrate holder 208 may include a heater 216 for raising and maintaining a temperature of substrate 204 above ambient. In some embodiments, heater 216 may be mechanically decoupled from substrate 204. For example, in one embodiment heating lamps (e.g., one or more halogen lamps) inside chamber 206 may be used to uniformly heat the entire chamber 206 and substrate 204 to a desired temperature.

Mass-flux generator 212 is coupled to chamber 206 and includes an electron gun 218 and a crucible 220 for heating a mass source 222. Mass source 222 is contained within a pocket 224 of the crucible 220 and sits adjacent the electron gun 218. The electron gun 218 is configured to generate a beam of electrons 226 from a filament and arc electron beam 226 into pocket 224 of crucible 220 via an electromagnetic field. Energy from electron beam 226 is absorbed by mass source 222, thereby producing heat, which induces evaporation of the mass source. A water cooling circuit (not shown) may be incorporated into crucible 220 to prevent crucible 220 from decomposing or melting. Crucible 220 is electrically grounded, and evaporation of mass source 222 is operable to generate a mass flux 228 that is received by substrate holder 208.

Mass flux 228 may include elements, molecules, or a combination thereof. Impingement of the mass flux 228 onto the substrate 204, or onto existing films already formed on the substrate 204, forms a film in ICE 202. In some embodiments, crucible 220 contains two or more pockets 224 for holding two or more different mass sources 222. In such embodiments, electron gun 218 arcs the beam of electrons 226 into the appropriate pocket 224 to heat the desired mass source 222. This configuration may allow system 200 to fabricate ICE 202 with minimal exposure of chamber 206 to an ambient environment (i.e., to introduce a new mass source 222). In some embodiments, crucible 220 contains two or more pockets 224 for containing mass sources of elemental silicon (Si) and silicon dioxide ($SiO_2$). In these embodiments, mass-flux generator 212 is operational to form films of Si and $SiO_2$, respectively. It should be understood that other techniques might be used; for example, without limitation, two separate electron guns for Si and $SiO_2$ might equally be used, without departing from the scope of the disclosure.

Ion-beam generator 214 may be configured to produce and direct an ion beam 230 of elements, molecules, or a combination thereof towards substrate 204. Ion beam 230 impinges upon the forming film and may promote control over film properties such as morphology, density, stress level, crystallinity, and chemical composition. Ion beam 230 has features such as flux, or dose, energy, and an angle of incidence 215. The flux is the number of ions flowing per unit of cross-sectional area. Accordingly, the flux is related to the dose in that a higher flux results in a higher dosage of ions provided to substrate 204. The depth reached by the ions upon impinging on substrate 204 is determined by the energy and the angle of incidence 215 of ion beam 230.

Further according to some embodiments, ion beam generator 214 and substrate holder 208 are configured to move relative to each other and produce a free carrier density distribution through a single layer of material in the multi-layer stack of materials forming ICE 202. Thus, correcting axially distributed defects of the optical properties of ICE 202, where the axial direction is defined by the normal to a plane parallel or approximately parallel to the layers forming the ICE stack (e.g., horizontal axis in FIG. 1). Accordingly, ion beam generator 214 and substrate holder 208 may be configured for axially displacing ICE 202 so that the ion beam targets different areas of the same target material layer in ICE 202 with a selected ion dosage.

Ion-beam generator 214 may produce ion beam 230 from a gas source such as oxygen, nitrogen, argon, or a combination thereof. Other gas sources are possible, such as Boron (B), Phosphorus (P), Arsenic (As), and other sources such as those used as charge carrier dopants in semiconductor fabrication. More generally, ion-beam generator 214 may include any ion source as is well known in the art. In at least one embodiment, ion-beam generator 214 produces ion beam 230 using an argon gas source. In other embodiments, ion-beam generator 214 produces ion beam 230 using a mixed gas source. The mixed gas source may be pre-mixed before introduction into the chamber 206 or may be mixed in chamber 206, proximate to ion-beam generator 214. Non-limiting examples of mixed gas sources include argon gas and silane gas, argon gas and methane gas, and argon gas, methane gas, and tetrafluoromethane gas. The aforementioned mixed gas sources are operable to form films of, respectively, hydrogenated amorphous silicon films, films of silicon carbide, and films of silicon carbide alloy, $Si_{1-x-y-z}C_xH_yF_z$. The compositional boundaries of the silicon carbide alloy are defined by the relation: $x+y+z<1$ where x is non-zero.

Ion implantation is a materials processing technique that may be used to selectively engineer the chemical, electrical, and optical properties of a material. Accordingly, ions of a particular atomic species (e.g., B, P, As, and others) may be created in an ion source and (electrostatically) accelerated towards the film stack with characteristic energies between 10-500 keV. As a result of the range of energies, the ion implantation process can be tailored to target penetration depths between 10 nm-1 micron, or more. Depending on the dose of ions, energy, and implant angle of incidence 215, the ions may chemically interact with the host material and change the electronic structure, or remain as interstitial dopants that will require a subsequent high temperature activation anneal.

The process of ion implantation introduces free charge carriers (either holes or electrons, depending on the ion species and the host material) into the host material. The density of the free charge carriers, Nc, is related to the material's refractive index, $n(\omega)$, via the plasmon frequency, $\omega_p$:

$$n(\omega)^2 = 1 - \frac{\omega_p^2}{\omega^2 + i\omega\gamma} \quad \text{Equation (1)}$$

where $\omega=2\pi/\lambda$ and is the frequency of the electromagnetic radiation; $\lambda$ is the wavelength of electromagnetic radiation; and the plasmon frequency $\omega_p$ satisfies the following expression:

$$\omega_p^2 = \frac{N_c e^2}{m_0 \varepsilon_0} \quad \text{Equation (2)}$$

where e is the electronic charge; $m_0$ is the charge carrier effective mass (electron or hole); $\varepsilon_o$ is the static dielectric constant; and $\gamma^{-1}$ is the relaxation time associated with free carrier lifetime broadening/damping. It should be noted that the sign of the charged carrier does not affect the index of refraction, according to Equations (1) and (2). Moreover, it should be mentioned that Equation (1) and (2) are only one simplified model of how the presence of free carriers may affect the optical properties of a thin-film based Integrated Computational Element material. Moreover, the model in Equations (1) and (2) may be applicable through a specific wavelength range (or frequency range, $\omega$). In embodiments consistent with the present disclosure, Equations (1) and (2) may be applicable in the near infrared (NIR) to mid-infrared (MIR) and infrared (IR) wavelength regions from about 900 nm to about 20 µm in wavelength. More detailed models may include more complex expressions for the dependence of $n^2$ on $N_c$. Other models may include, for example, inter-band absorption terms in the visible (VIS) and ultraviolet (UV) wavelength spectrum. All these models are consistent with embodiments disclosed herein, as one of ordinary skill may recognize. Equations (1) and (2) indicate that the optical properties of a material, which are determined by the real and imaginary parts of the index of refraction, n and k, may be altered by injecting free carriers in the material. Accordingly, ion implantation may be used to inject free carriers with a concentration $N_c$ in a layer material.

Still referring to FIG. 2, a measurement device 232 is associated with chamber 206. Measurement device 232 is oriented towards substrate 204 and configured to measure in-situ a thickness, a complex index of refraction, or both, of a layer formed by the mass-flux generator 212 on substrate 204. Accordingly, measurement device 232 may be configured to perform optical, mechanical, and even electrical measurements on substrate 204. In some embodiments, measurement device 232 includes an ellipsometer 234 for measuring the thickness, the complex index of refraction, or both. In some embodiments, measurement device 232 includes a spectrometer 236 for measuring an optical spectrum of ICE 202 during fabrication. In some embodiments, measurement device 232 includes a quartz monitor or a single wavelength monitor for thickness.

While not explicitly shown, in some embodiments, measurement device 232 may further include a probe and a detector disposed on opposing sides of chamber 206 and at the same angle of incidence. While probes, e.g., ellipsometer 234 and spectrometer 236, may be coupled on one side of the chamber 206, it should be understood that corresponding detectors may be coupled on an opposite side of the chamber. Accordingly, FIG. 2 depicts optical measurement device 232, in 'reflection mode.' In some embodiments, optical measurement device 232 may be configured in transmission mode. Substrate 204 in FIG. 2 may act as a 'witness sample,' according to some embodiments. A witness sample is a substrate that may include ICE 202 or a test film, on which measurement device 232 performs measurements. One of ordinary skill will recognize that the witness sample may be located separate from substrate 204 holding the sample. For example, in some embodiments the witness sample may be placed in the center of chamber 206 and a planetary system of substrates 204, each carrying an ICE 202, may be moving around the witness sample.

A computational unit 238 may be communicably coupled to mass-flux generator 212 and to ion-beam generator 214. Computational unit 238 includes one or more processors 240 and one or more memories 242 to control film formation during fabrication of the integrated computational element 202. The computational unit 238 may be further coupled to the heater 216, if present, to manipulate the temperature of the substrate 204 during fabrication. Computational unit 238 may be coupled to measurement device 232 to control measurement of the thickness, the complex index of refraction, or both, of a layer formed by mass-flux generator 212.

In exemplary operation, a vacuum is formed in chamber 206 and electron beam 226 may be emanated from the electron gun 218. Electron beam 226 is directed into pocket 224 of crucible 220 by the electromagnetic field. Evaporation of mass source 222 produces mass flux 228, which traverses a distance from the crucible 220 to the substrate holder 208. Mass-flux generator 212 directs mass-flux 228 towards substrate 204 to form a material layer in ICE 202. The material layers in ICE 202 may include a dielectric layer (such as $SiO_2$), or a semiconducting layer (such as Si), or even a conducting layer (such as Aluminum —Al—). In coordination with mass-flux generator 212, ion-beam generator 214 directs ion beam 230 towards substrate 204. Such coordination is managed by computational unit 238 to control film formation during fabrication of the integrated computational element 202.

When the film has achieved its desired thickness, computational unit 238 may be configured to deactivate mass-flux generator 212 and ion beam generator 214. Heater 216, if present, may be functional during the formation process in order to improve film properties. Computational unit 238 may regulate mass-flux generator 212 and ion beam generator 214 to form a series of sequential films. The number, thickness, and refractive index (i.e., material) of sequential films in the series is specified by a target transmission or reflection spectrum of ICE 202. The design of ICE 202 produces alternating layers 102 (FIG. 1) of high refractive index (real part of the complex index of refraction) and layers 104 (FIG. 1) low refractive index (real part of the complex index of refraction). A terminal or capping layer 108 (FIG. 1) may also be present.

During fabrication of ICE 202, computational unit 238 may also be configured to control measurement device 232. Measurement device 232 may be used to measure in situ a thickness, a complex index of refraction, or both, of a formed film of the ICE 202. Measurement device 232 may be configured to measure a resulting optical spectrum of ICE 202 for at least one wavelength. The resulting optical spectrum of ICE 202 may be measured in transmission, in reflection, or in transmission and reflection modes. In some embodiments, computational unit 238 may be configured to store in a database the resulting optical spectrum of ICE 202 as each of the material layers is deposited thereon. Computational unit 238 may also be configured to store in the database a target optical spectrum of ICE 202 as each of the material layers is deposited thereon. In some embodiments, the database may be iteratively updated by computational unit 238 as each new layer is formed in ICE 202.

One or more processors 240 and one or more memories 242 of computational unit 238 are operable to develop or receive an optical model of ICE 202 as is being fabricated, using data stored in the database. The optical model may be used by processors 240 and memories 242 to obtain the resulting optical spectrum for ICE 202, in combination with data provided by measurement device 232. The resulting optical spectrum is compared to a target optical spectrum of ICE 202. By comparing the resulting optical spectrum with the target optical spectrum, fabrication of ICE 202 can be revised in situ to improve optical spectrum fidelity.

In some embodiments, computational unit 238 revises the design of integrated computational element 202 according to a program stored in the one or more memories 240 and executed by the one or more processors 238. Revisions of integrated computational element 202 may include altering the complex index of refraction of a given layer in the multilayer stack of ICE 202. Accordingly, altering the complex index of refraction of a selected layer may include adjusting ion beam generator 214 with a predetermined dose and a predetermined energy to implant ions on the selected layer. In some embodiments, the selected layer may be in formation on an exposed surface of ICE 202. In some embodiments, the selected layer may have already been formed and be buried in ICE 202 at a given depth. Accordingly, the depth of the selected layer may be obtained from the database in memories 242, where it is stored by measurement device 232.

Consistent with the present disclosure, ICE 202 may be fabricated using systems that employ other deposition techniques. Deposition techniques used to form the material layers in ICE 202, and to inject free carriers in the material layers may include, but are not limited to, unassisted electron beam evaporation, thermal evaporation, dc-sputtering, dc-magnetron sputtering, rf-sputtering, reactive physical vapor deposition (RPVD), physical vapor deposition (PVD), pulsed laser deposition (PLD), low pressure chemical vapor deposition (LPCVD), plasma-enhanced chemical vapor deposition (PECVD), atmospheric pressure chemical vapor deposition (APCVD), metal organic chemical deposition (MOCVD), and molecular beam epitaxy (MBE). Other deposition techniques are possible, by any feasible combination of the above techniques, as one of ordinary skill will recognize.

The effect of different charge carrier concentrations in the real and imaginary parts of the complex index of refraction of a material layer, such as used in ICE 202, is discussed in detail with reference to FIGS. 3 and 4 below.

Figure 3:
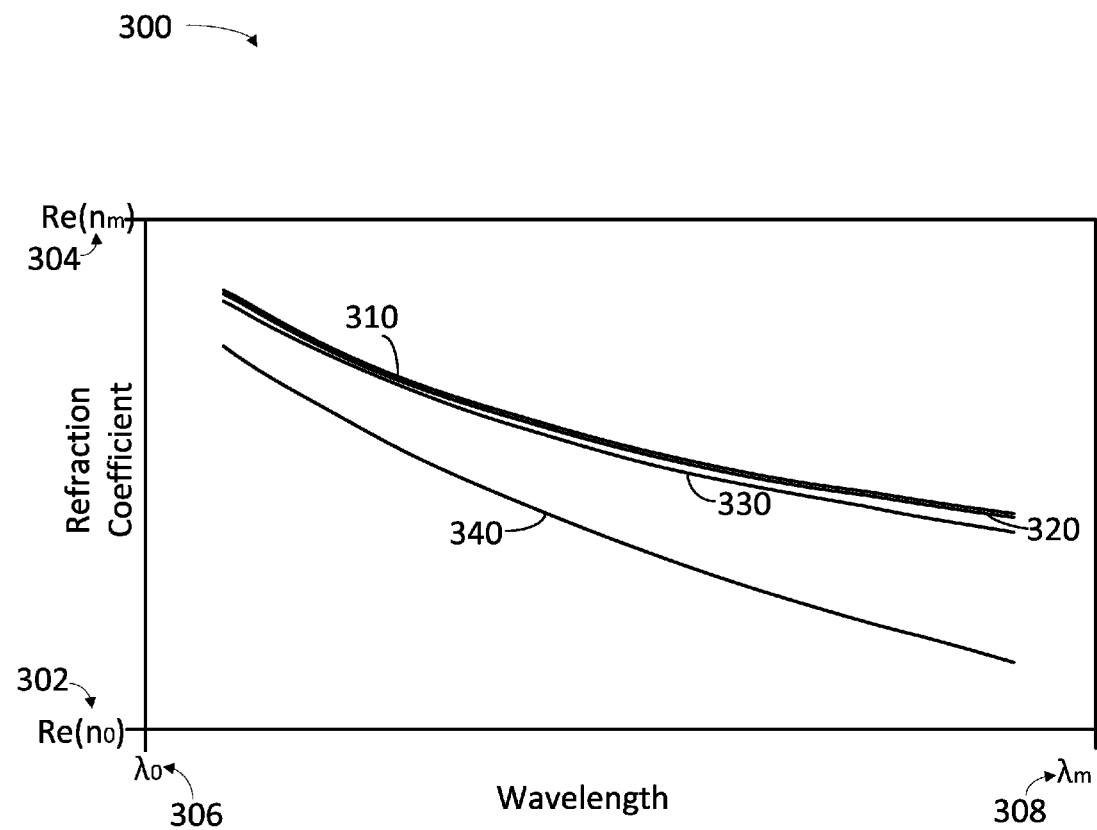
FIG. 3 illustrates changes induced in the refraction coefficient, Re(n), of a material layer as a function of wavelength for different charge carrier concentrations, according to some embodiments.

FIG. 3 illustrates changes induced in the real part of the index of refraction, Re(n), of a material layer as a function of different charge carrier concentration, according to some embodiments. Chart 300 in FIG. 3 shows wavelength in the abscissae, and refraction coefficient Re(n) in the ordinates. The refraction coefficient Re(n) in chart 300 is the real part of the index of refraction, n, of the material layer. Refraction coefficient in chart 300 may span a range from a minimum value, $n_o$ 302, to a maximum value, $n_m$ 304. Wavelength in chart 300 may span a range from a minimum value, $\lambda_o$ 306, to a maximum value, $\lambda_m$ 308.

In some embodiments, the material layer in FIG. 3 may include Si, in which case $n_o$ 302 may be about 3.4, and $n_m$ 304 may be about 3.5, for a wavelength range spanning from $\lambda_o$ 306 of about 1500 nm to $\lambda_m$ 308 of about 2500 nm. Curves 310, 320, 330, and 340 illustrate the change of refraction coefficient of with wavelength, for different concentration of free carriers in the semiconductor material. Accordingly, curve 310 corresponds to the intrinsic free carrier concentration $N_{ci}$ (in Si, at 300K, $N_{ci} \sim 10^{15}$ e/cm$^3$). Curve 320 shows the refraction coefficient with a free carrier concentration of about $100 \times N_{ci}$. Curve 330 shows the refraction coefficient with a free carrier concentration of about $1000 \times N_{ci}$. In addition, curve 340 shows the refraction coefficient with a free carrier concentration of about $10000 \times N_{ci}$.

Figure 4:
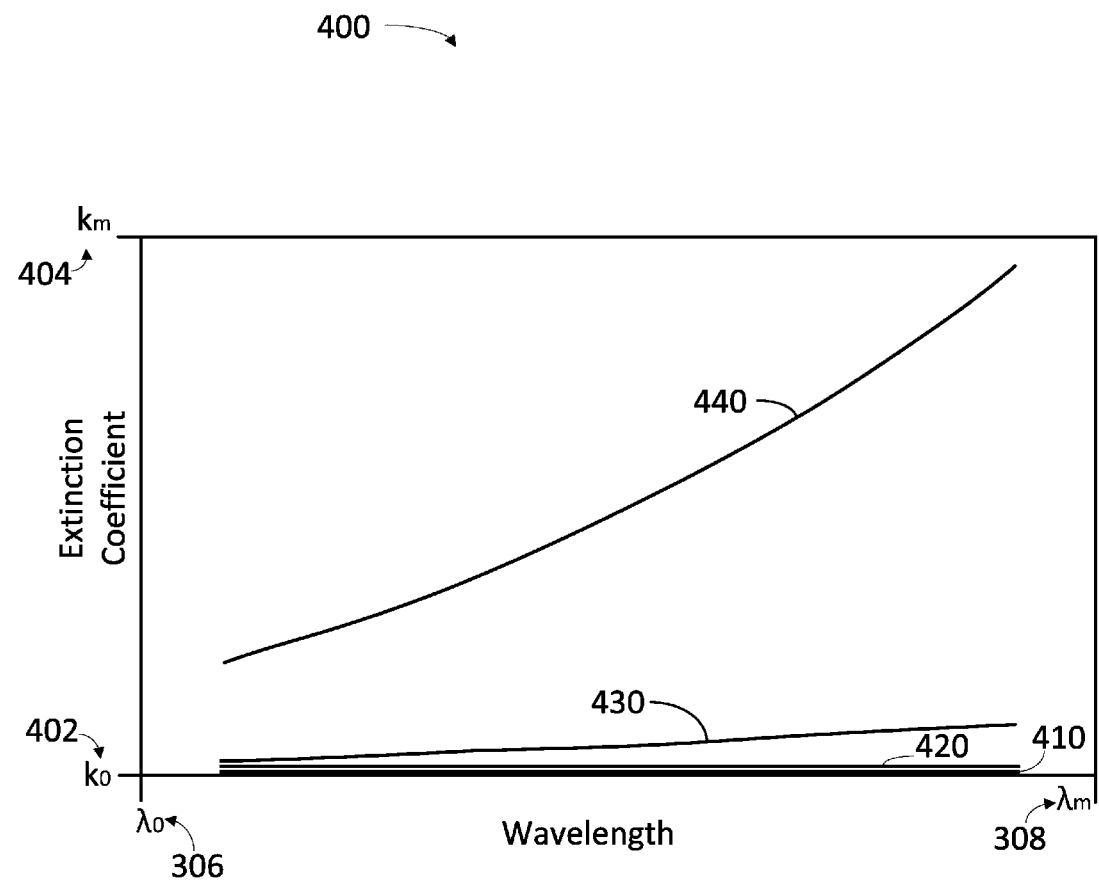
FIG. 4 illustrates changes induced in the extinction coefficient, k, of a material layer as a function of wavelength for different charge carrier concentrations, according to some embodiments.

FIG. 4 illustrates changes induced in the extinction coefficient, k, of a material layer as a function of different charge carrier concentration, according to some embodiments. Chart 400 in FIG. 4 shows wavelength in the abscissae, and extinction coefficient in the ordinates. The extinction coefficient in chart 400 is the imaginary part, k, of the complex index of refraction, n, of the material layer. Extinction coefficient in chart 400 may span a range from a minimum value $k_o$ 402 to a maximum value, $k_m$ 404. Values $\lambda_o$ 306 and $\lambda_m$ 308 in Chart 400 are as discussed in chart 300, above. In some embodiments, the material layer in FIG. 4 may include Si, in which case $k_o$ 402 may be about zero, and $k_m$ 404 may be about 0.004, for a wavelength range spanning from $\lambda_o$ 306 of about 1500 nm to $\lambda_m$ 308 of about 2500 nm. Curves 410, 420, 430, and 440 illustrate the change of extinction coefficient with wavelength, for different concentration of free carriers in the dielectric material. Accordingly, curve 410 corresponds to the intrinsic free carrier concentration $N_{ci}$. Curve 420 shows the extinction coefficient with a free carrier concentration of about $100 \times N_{ci}$. Curve 430 shows the extinction coefficient with a free carrier concentration of about $1000 \times N_{ci}$. In addition, curve 440 shows the extinction coefficient with a free carrier concentration of about $10000 \times N_{ci}$.

To facilitate a better understanding of the present disclosure, an example of engineering optical properties of an ICE by ion implantation is described in relation to FIGS. 5-7 below. In no way should the following example be read to limit, or to define, the scope of the disclosure.

Figure 5:
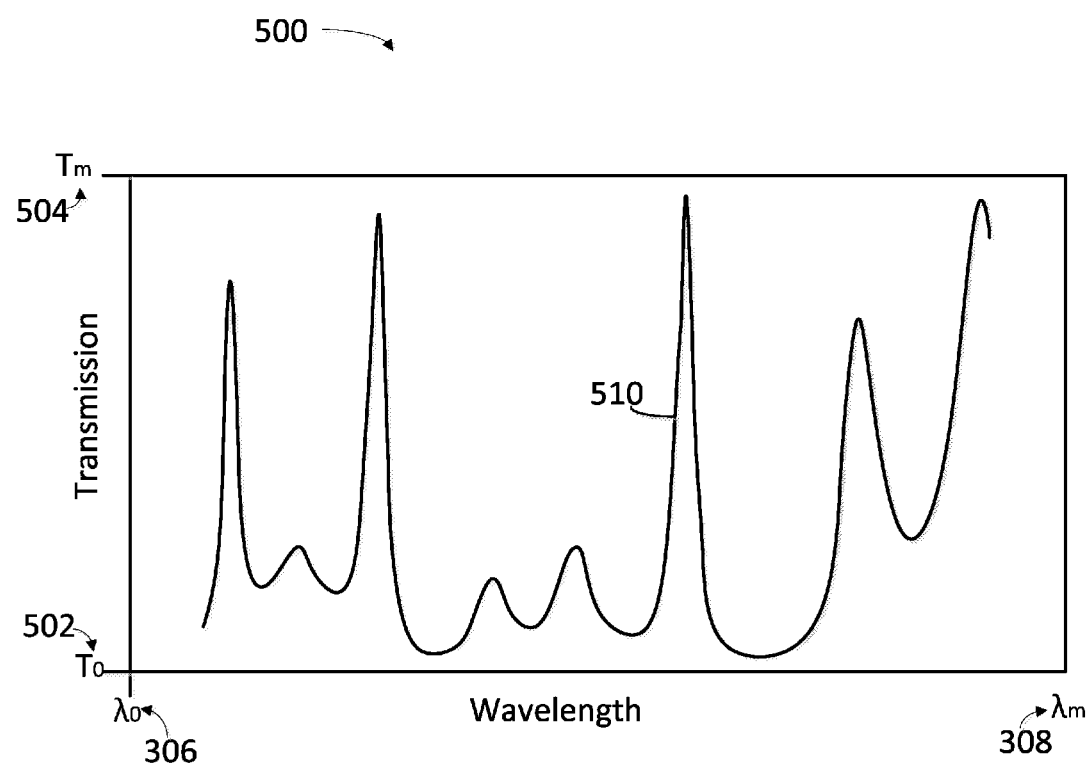
FIG. 5 illustrates a target transmission spectrum of an ICE, according to some embodiments.

FIG. 5 illustrates the target transmission spectrum (curve 510) of ICE 202 being fabricated in system 200 (FIG. 2), according to some embodiments. Chart 500 in FIG. 5 shows wavelength in the abscissae, and transmission coefficient in the ordinates. Transmission coefficient in chart 500 may span a range from a minimum value, $T_o$ 502, to a maximum value, $T_m$ 504. Accordingly, $T_0$ 502 may be zero and $T_m$ 504 may be one (1.0). Values $\lambda_o$ 306 and $\lambda_m$ 308 in chart 500 are as discussed in charts 300 and 400, above. In this example, curve 510 in FIG. 5 may represent an expected transmission spectrum for the ninth layer of an ICE film stack being fabricated in system 200 after a ninth layer of material (e.g., Si) has been deposited.

Figure 6:
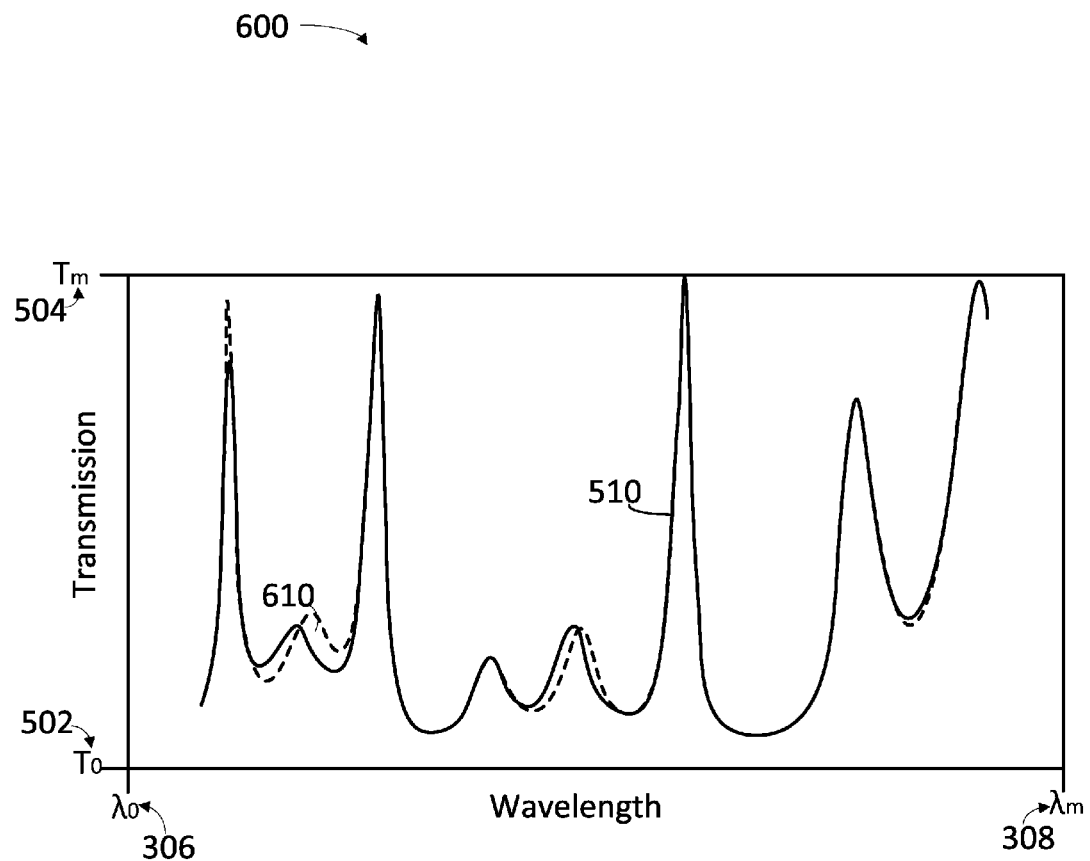
FIG. 6 illustrates the target transmission spectrum of an ICE and the resulting transmission spectrum of an ICE when a material layer is deposited on the ICE stack, according to some embodiments.

FIG. 6 illustrates target transmission spectrum having curve 510 and the resulting transmission spectrum having curve 610 of ICE 202. The resulting transmission spectrum may be collected by measurement device 232 (FIG. 2) when a ninth layer of material is deposited on the ICE, according to some embodiments. As can be seen in chart 600, curve 610 is not an exact match of curve 510, thereby indicating a loss of fidelity in certain portions of the spectrum. The loss of fidelity may be the result of a fabrication error due to a random instrument fluctuation, drift, or some other variation. For example, during the fabrication process, the ninth layer may have been deposited to a thickness slightly thicker than what the model required. An additional 10 nm of Si, for instance, may have been deposited over the intended Si film thickness in the ninth layer.

In order to correct for the mismatch, system 200 may be configured to direct ion beam generator 214 (FIG. 2) to inject a predetermined concentration of free carriers Nc in the ninth layer of ICE 202. Ion beam generator 214 may then be configured with a dose and an energy selected to produce the desired $N_c$ at the desired depth. Accordingly, the energy of the ion beam 230 (FIG. 2) may be selected to reach a depth of about the thickness of the ninth layer in ICE 202. When ion beam generator 214 provides the free carrier concentration Nc, measurement device 232 may be configured to collect a spectrum from ICE 202. The result is an ion implant-engineered spectrum having a curve that may be closer to curve 510 than curve 610. The difference between the target transmission profile and the ion engineered transmission spectra is illustrated in FIG. 7, described in detail below.

Figure 7:
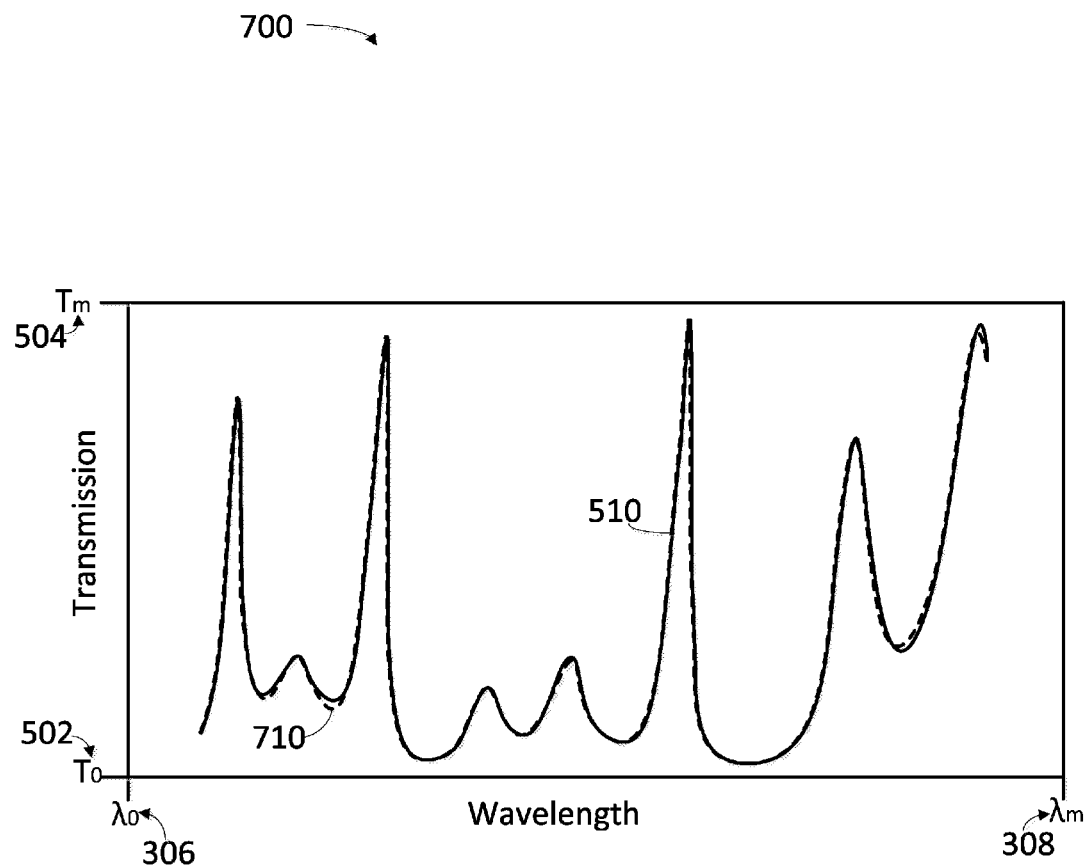
FIG. 7 illustrates the target transmission spectrum of an ICE and an engineered transmission spectrum of an ion implanted ICE, according to some embodiments.

FIG. 7 illustrates the target transmission spectrum of ICE 202 (curve 510) and the engineered transmission spectrum of an ion implanted engineered ICE (curve 710), according to some embodiments. As an illustrative example, FIG. 7 shows the result of increasing the free carrier concentration in the ninth layer of ICE 202 (FIGS. 5 and 6) from $N_{ci}$ (in Si) to about $10000 \times N_{ci}$. For this particular example, as can be seen in the chart 700, increasing the intrinsic carrier concentration provides better agreement between curve 510 and curve 710.

Figure 8:
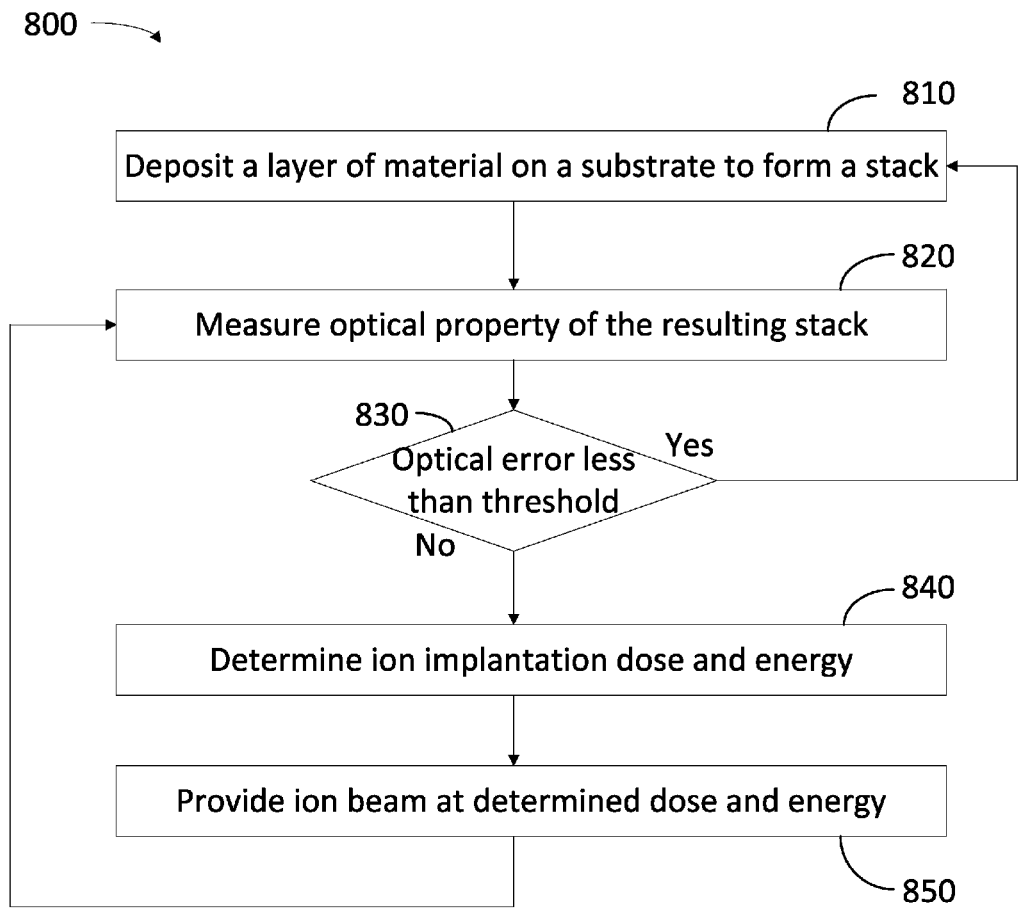
FIG. 8 illustrates a flow chart including steps in a method for engineering the optical properties of an ICE, according to some embodiments.

FIG. 8 illustrates a flow chart including steps in a method 800 for engineering the optical properties of an ICE, according to some embodiments. Embodiments of method 800 may include performing the steps illustrated in FIG. 8 in any order or sequence, other than the specific sequence illustrated in FIG. 8. Moreover, embodiments of method 800 consistent with the present disclosure may include performing only some of the steps illustrated in FIG. 8, and not others. Method 800 may be performed by a system for fabricating an ICE on a substrate consistent with embodiments disclosed herein (e.g., system 200, ICE 202, and substrate 204 of FIG. 2). Accordingly, the system in method 800 may include an ion beam generator, a measurement device, and a substrate to support the ICE (e.g., ion beam generator 214, measurement device 232, and substrate 204).

Step 810 includes depositing a layer of material on a substrate to form a stack. The layer of material may be the first layer of material in the stack, or there may be other layers of material forming the stack. The stack of layers of material in step 810 may form a partially completed ICE. Step 820 includes measuring an optical property of the resulting stack (or layer). In some embodiments, step 820 may include measuring an optical property of the single layer being deposited, or an aggregated value of an optical property of the partially completed stack. In some embodiments, step 820 may include measuring an index of refraction and/or thickness. In some embodiments, step 820 may include obtaining an optical spectrum. For example, in some embodiments step 820 may include obtaining a transmission spectrum, a reflection spectrum, or both.

Step 830 may include querying whether an optical error is less than a threshold. Accordingly, step 830 may include obtaining an optical error (if any) by using the measured optical property and an optical model to obtain a resulting optical value. Step 830 may further include comparing the resulting optical value with a target optical value. Furthermore, in some embodiments step 830 includes determining a threshold based on the optical model and an ICE specification or design. When the optical error is less than the threshold according to 830, then the method repeats from step 810 with a new material layer.

When the optical error is greater than or equal to the threshold according to 830, then step 840 may include determining an ion implantation dose and energy. Step 840 may also include determining a depth in the stack for depositing the ions. For example, step 840 may determine that the ion beam should target a buried material layer. In such a scenario, step 840 may include tilting the ion beam at a desired angle of incidence relative to the multilayer stack (angle of incidence 215 of FIG. 2), so that a buried material layer may be targeted. In some embodiments, tilting the ion beam at a desired angle of incidence may include tilting the substrate of the multilayer stack. Step 850 includes providing an ion beam at the determined dose and energy to the stack.

In view of the above description, method 800 may be part of an ICE fabrication procedure that includes in situ engineering of the optical properties of the material layers forming the ICE, layer by layer. In some embodiments, method 800 may correct the optical performance of the ICE when fabrication is complete, i.e., ex-situ. In yet further embodiments, method 800 may correct axially distributed defects of the optical properties of the ICE, where the axial direction is defined by the normal to a plane parallel or approximately parallel to the layers forming the ICE stack.

For example, in some embodiments a single material layer may not have uniform optical properties across the entire material layer, due to shadowing effects during fabrication. To correct for deviations to the optical properties within each material layer, step 850 may include scanning the ion beam selectively across the surface of the ICE. Accordingly, in some embodiments step 850 may include a raster scan of the substrate across the ion beam, to achieve an in-plane adjustment to the index of refraction of a selected material layer. Step 850 may therefore further include axially displacing the ICE so that the ion beam targets different areas of the same target material layer with a selected ion dosage. According to some embodiments, step 850 may also include placing a mask over the multilayer stack. The mask then shadows portions of the ion beam along the plane of the target material layer, creating the desired in-plane adjustment of the index of refraction.

Method 800 is an exemplary embodiment of ion implantation engineering of the optical properties of ICE. There may be applications of interest where a target optical property is not achievable with the existing intrinsic variability of a fabrication process. In such circumstances, method 800 using an ion implantation step such as step 850 enables fine-tuning the optical property of the ICE, to obtain the target value. More generally, method 800 adjusts the complex index of refraction of selected material layers as desired.

It is recognized that the various embodiments herein directed to computer control and artificial neural networks, including various blocks, modules, elements, components, methods, and algorithms, can be implemented using computer hardware, software, combinations thereof, and the like. To illustrate this interchangeability of hardware and software, various illustrative modules, elements, components, methods and algorithms have been described generally in terms of their functionality. Whether such functionality is implemented as hardware or software will depend upon the particular application and any imposed design constraints. For at least this reason, it is to be recognized that one of ordinary skill in the art can implement the described functionality in a variety of ways for a particular application. Further, various components and blocks can be arranged in a different order or partitioned differently, for example, without departing from the scope of the embodiments expressly described.

Computer hardware used to implement the various illustrative blocks, modules, elements, components, methods, and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable read only memory (EPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Embodiments disclosed herein include:

A. A system for fabricating an Integrated Computational Element (ICE) device that includes a chamber, a material source contained within the chamber, an ion-beam generator configured to provide an ion beam, a substrate holder to support a multilayer stack of materials that form the ICE device, a measurement system, and a computational unit, wherein the material source provides a material layer to the multilayer stack, and at least a portion of the ion beam is deposited in the material layer according to an optical value provided by the measurement system.

B. A method for fabricating an Integrated Computational Element (ICE) device that includes depositing a layer of material on a substrate to form a stack, measuring an optical property of the stack, determining a dose and an energy for an ion beam when an optical error of the optical property is greater than a pre-selected threshold, and directing the ion beam with the determined dose and energy to the stack.

C. A non-transitory, computer readable medium storing commands that, when executed by a processor in a computer unit included in a system for fabricating an Integrated Computational Element (ICE) device, cause the system to perform a method that includes measuring an optical property of a multilayer stack of materials that form the ICE device, comparing the optical property with a target optical property of the ICE device, determining a concentration of free carriers in at least one layer of material in the multilayer stack required to reduce a difference between the optical property and the target optical property, and providing the concentration of free carriers to the at least one layer of material.

Each of embodiments A, B, and C may have one or more of the following additional elements in any combination: Element 1: wherein the ion-beam generator is configured to provide a selected dose of ions at a selected energy and with a selected angle of incidence to the multilayer stack. Element 2: wherein the measurement system comprises an optical system configured to provide broadband electromagnetic radiation to the multilayer stack, an optical transducer to measure the electromagnetic radiation after it interacts with the ICE in-situ and provide a signal, and a recording device to store the signal. Element 3: wherein the signal provided by the measurement system is one of a broadband transmission spectrum, a broadband reflection spectrum, and a combination of a broadband transmission and reflection spectra. Element 4: wherein the ion-beam generator is configured to provide the ion beam to increase a free carrier concentration at a selected layer in the multilayer stack of materials that form the ICE device. Element 5: wherein the ion-beam generator is configured to provide the ion beam formed with ions from the group consisting of Oxygen, Argon, Boron, Phosphorus, Arsenic, Gallium, and Nitrogen. Element 6: wherein the ion-beam generator and the substrate holder are configured to move relative to each other to produce a free carrier density distribution through a single layer of material in the multilayer stack of materials that form the ICE device.

Element 7: wherein measuring an optical property comprises obtaining an electromagnetic radiation spectrum from the stack, and comparing the electromagnetic radiation spectrum with a target spectrum to obtain the optical error. Element 8: wherein determining a dose for the ion beam comprises determining a desired refraction coefficient for at least one layer in the stack. Element 9: wherein determining a dose for the ion beam comprises determining a desired extinction coefficient for at least one layer in the stack. Element 10: wherein determining an energy for the ion beam comprises determining a depth of at least one target layer in the stack. Element 11: wherein directing the ion beam comprises targeting the deposited layer of material with the ion beam. Element 12: wherein directing the ion beam comprises targeting a layer of material under the deposited layer of material with the ion beam. Element 13: wherein directing the ion beam comprises tilting the ion beam at a desired angle of incidence relative to the stack. Element 14: wherein directing the ion beam comprises forming a concentration of free charge carriers in at least one layer of material in the stack.

Element 15: wherein determining a concentration of free carriers comprises determining at least one of a dose, an energy, and an angle of incidence for an ion beam to be directed to the at least one layer of material. Element 16: wherein providing the concentration of free carriers to the at least one layer of material comprises directing the ion beam with at least one of a determined dose, energy, and angle of incidence to the at least one layer of material. Element 17: wherein measuring an optical property comprises using at least one of ellipsometry, spectroscopy, and interferometry. Element 18: wherein determining a concentration of free carriers comprises selecting a complex index of refraction for the at least one layer of material. Element 19: wherein determining a concentration of free carriers comprises selecting an ion source from the group of Oxygen, Argon, Boron, Phosphorus, Arsenic, Gallium, and Nitrogen.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

What is claimed is:

1. A method for fabricating a multilayer stack for use as an optical device, comprising:
depositing a plurality of layers of material on a substrate to form the multilayer stack, the plurality of layers including alternating layers of a first type of material and a second type of material, the second type of material being different from the first type of material;
for each layer of the multilayer stack:
measuring a thickness of the layer with a measurement system;
determining whether the layer includes the first type of material or the second type of material;
determining a complex index of refraction for the layer, the complex index of refraction being determined using a first refraction coefficient and a first extinction coefficient when the layer was determined to include the first type of material, or the complex index of refraction being determined using a second refraction coefficient and a second extinction coefficient when the layer was determined to include the second type of material, the first refraction coefficient being different from the second refraction coefficient and the first extinction coefficient being different from the second extinction coefficient; and
determining a resulting electromagnetic radiation spectrum for the layer based on the thickness and the complex index of refraction of the layer;
determining an optical error value for at least one layer of the multilayer stack based on a comparison of the resulting electromagnetic radiation spectrum of the at least one layer to a desired electromagnetic radiation spectrum of the at least one layer;
determining that the optical error value of the at least one layer exceeds a pre-determined threshold, the at least one layer including a first charge carrier concentration;
determining, in response to the optical error value exceeding the pre-determined threshold, a predetermined charge carrier concentration, the predetermined charge carrier concentration being associated with a first density of charge carriers when the at least one layer includes the first type of material and a second density of charge carriers when the at least one layer includes the second type of material, the second density of charge carriers being different from the first density of charge carriers;

determining a dose and an energy for an ion beam provided by an ion beam generator based on the predetermined charge carrier concentration; and altering the complex index of refraction of the at least one layer by ion implantation using the ion beam with the determined dose and energy, the at least one layer with the altered complex index of refraction including a second charge carrier concentration, wherein the ion implantation increased the first charge carrier concentration to the second charge carrier concentration by the predetermined charge carrier concentration.

2. The method of claim 1, wherein determining the dose for the ion beam comprises determining a desired refraction coefficient for the at least one layer of the multilayer stack as a function of the second charge carrier concentration.

3. The method of claim 1, wherein determining the dose for the ion beam comprises determining a desired extinction coefficient for the at least one layer of the multilayer stack as a function of the second charge carrier concentration.

4. The method of claim 1, wherein determining the energy for the ion beam comprises determining a depth of the at least one layer in of the multilayer stack.

5. The method of claim 1, wherein altering the complex index of refraction comprises directing the ion beam at a desired angle of incidence relative to the at least one layer of the multilayer stack.

6. The method of claim 1, wherein the at least one layer of the multilayer stack is a layer of material under one or more deposited layers of the plurality of layers.

7. The method of claim 5, wherein directing the ion beam comprises tilting the ion beam at the desired angle of incidence relative to a normal of the multilayer stack.

8. The method of claim 5, wherein directing the ion beam comprises forming a concentration of a dopant in the at least one layer of the multilayer stack.

9. A method, comprising:
for each layer of a plurality of layers of material on a substrate:
measuring a thickness of the layer with a measurement system, the plurality of layers formed in a multilayer stack for use as an optical device, the plurality of layers including alternating layers of a first type of material and a second type of material, the second type of material being different from the first type of material;
determining whether the layer includes the first type of material or the second type of material;
determining a complex index of refraction for the layer, the complex index of refraction being determined using a first refraction coefficient and a first extinction coefficient when the layer was determined to include the first type of material, or the complex index of refraction being determined using a second refraction coefficient and a second extinction coefficient when the layer was determined to include the second type of material, the first refraction coefficient being different from the second refraction coefficient and the first extinction coefficient being different from the second extinction coefficient; and
determining a resulting electromagnetic radiation spectrum for the layer based on the thickness and the complex index of refraction of the layer;

comparing the resulting electromagnetic radiation spectrum of at least one layer of the multilayer stack to a desired electromagnetic radiation spectrum of the at least one layer;

determining an optical error value for at least one layer based on the comparison;

determining that the optical error value of the at least one layer exceeds a pre-determined threshold, the at least one layer including a first charge carrier concentration;

determining, in response to the optical error value exceeding the pre-determined threshold, a predetermined charge carrier concentration, the predetermined charge carrier concentration being associated with a first density of charge carriers when the at least one layer includes the first type of material and a second density of charge carriers when the at least one layer includes the second type of material, the second density of charge carriers being different from the first density of charge carriers; and altering the complex index of refraction of the at least one layer by ion implantation, the at least one layer with the altered complex index of refraction including a second charge carrier concentration, wherein the ion implantation increased the first charge carrier concentration to the second charge carrier concentration by the predetermined charge carrier concentration.

10. The method of claim 9, further comprising:
determining a dose and an energy for an ion beam provided by an ion beam generator based on the determination that the optical error value of the at least one layer exceeds the pre-determined threshold, the complex index of refraction being altered by the ion implantation, using the determined dose and energy of the ion beam.

11. The method of claim 10, wherein determining the dose for the ion beam comprises determining a desired refraction coefficient for the at least one layer as a function of the second charge carrier concentration.

12. The method of claim 10, wherein determining the dose for the ion beam comprises determining a desired extinction coefficient for the at least one layer as a function of the second charge carrier concentration.

13. The method of claim 10, wherein determining the energy for the ion beam comprises determining a depth of the at least one layer in the multilayer stack.

14. The method of claim 10, wherein altering the complex index of refraction comprises directing the ion beam at a desired angle of incidence relative to the at least one layer.

15. A method, comprising:
depositing a plurality of layers of material in a multilayer stack on a substrate for use as an optical device, the plurality of layers including alternating layers of a first type of material and a second type of material, the second type of material being different from the first type of material;
for each layer of the multilayer stack:
measuring a thickness of the layer with a measurement system;
determining whether the layer includes the first type of material or the second type of material;
determining a complex index of refraction for the layer, the complex index of refraction being determined using a first refraction coefficient and a first extinction coefficient when the layer was determined to include the first type of material, or the complex index of refraction being determined using a second refraction coefficient and a second extinction coefficient when the layer was determined to include the second type of material, the first refraction coefficient being different from the second refraction coefficient and the first extinction coefficient being different from the second extinction coefficient; and determining a resulting electromagnetic radiation spectrum for the layer based on the thickness and the complex index of refraction of the layer;

comparing the resulting electromagnetic radiation spectrum of at least one layer of the multilayer stack to a desired electromagnetic radiation spectrum of the at least one layer;

determining an optical error value for at least one layer based on the comparison;

determining that the optical error value of the at least one layer exceeds a pre-determined threshold, the at least one layer including a first charge carrier concentration;

determining, in response to the optical error value exceeding the pre-determined threshold, a predetermined charge carrier concentration, the predetermined charge carrier concentration being associated with a first density of charge carriers when the at least one layer includes the first type of material and a second density of charge carriers when the at least one layer includes the second type of material, the second density of charge carriers being different from the first density of charge carriers;

determining a dose and an energy for an ion beam provided by an ion beam generator based on the predetermined charge carrier concentration; and altering the complex index of refraction of the at least one layer by ion implantation using the determined dose and energy of the ion beam, the at least one layer with the altered complex index of refraction including a second charge carrier concentration, wherein the ion implantation increased the first charge carrier concentration to the second charge carrier concentration by the predetermined charge carrier concentration.

16. The method of claim 15, wherein determining the dose for the ion beam comprises determining a desired refraction coefficient for the at least one layer as a function of the second charge carrier concentration.

17. The method of claim 15, wherein determining the dose for the ion beam comprises determining a desired extinction coefficient for the at least one layer as a function of the second charge carrier concentration.

18. The method of claim 15, wherein altering the complex index of refraction comprises directing the ion beam at a desired angle of incidence relative to the at least one layer.

19. The method of claim 18, wherein directing the ion beam comprises tilting the ion beam at the desired angle of incidence relative to a normal of the plurality of layers of material.

20. The method of claim 18, wherein directing the ion beam comprises forming a concentration of a dopant in the at least one layer.

* * * * *